United States Patent
Kwong et al.

(10) Patent No.: US 7,145,083 B2
(45) Date of Patent: Dec. 5, 2006

(54) REDUCING OR ELIMINATING CROSS-TALK AT DEVICE-SUBSTRATE INTERFACE

(75) Inventors: Herman Kwong, Kanata (CA); Aneta Wyrzykowska, Dunrobin (CA); Larry Marcanti, Allen, TX (US)

(73) Assignee: Nortel Networks Limited (CA)

( * ) Notice: Subject to any disclaimer, the term of this patent is extended or adjusted under 35 U.S.C. 154(b) by 65 days.

(21) Appl. No.: 10/890,004

(22) Filed: Jul. 13, 2004

(65) Prior Publication Data

US 2006/0011384 A1 Jan. 19, 2006

(51) Int. Cl.
*H05K 1/16* (2006.01)

(52) U.S. Cl. ............ 174/260; 174/255; 174/262; 174/250; 439/609; 361/816

(58) Field of Classification Search ............ 174/255, 174/36, 78, 258, 260, 262, 265
See application file for complete search history.

(56) References Cited

U.S. PATENT DOCUMENTS

| | | | | |
|---|---|---|---|---|
| 4,816,616 A | * | 3/1989 | Jones | 174/251 |
| 5,426,399 A | * | 6/1995 | Matsubayashi et al. | 333/1 |
| 5,677,515 A | * | 10/1997 | Selk et al. | 174/255 |
| 6,181,219 B1 | * | 1/2001 | Gailus et al. | 333/33 |
| 6,353,189 B1 | * | 3/2002 | Shimada et al. | 174/255 |
| 6,388,208 B1 | * | 5/2002 | Kiani et al. | 174/266 |
| 6,444,922 B1 | * | 9/2002 | Kwong | 174/261 |
| 6,608,258 B1 | * | 8/2003 | Kwong et al. | 174/258 |
| 6,617,526 B1 | * | 9/2003 | Miller | 174/261 |
| 6,747,216 B1 | * | 6/2004 | Brist et al. | 174/262 |
| 6,872,595 B1 | * | 3/2005 | Kwong et al. | 438/109 |
| 6,899,550 B1 | * | 5/2005 | Perugini et al. | 439/74 |
| 2002/0060090 A1 | * | 5/2002 | Ozeki et al. | 174/256 |
| 2002/0108778 A1 | * | 8/2002 | Dishongh et al. | 174/261 |
| 2004/0231888 A1 | * | 11/2004 | Chan et al. | 174/266 |

* cited by examiner

*Primary Examiner*—Kamand Cuneo
*Assistant Examiner*—Hoa Nguyen
(74) *Attorney, Agent, or Firm*—McGuinness & Manaras LLP (57) ABSTRACT

Inter-layer shielding is employed to shield printed circuit board transmission lines from EMI and cross-talk at traversals between adjacent inner layers, between inner layers separated by one or more inner layers, between an outer layer and an adjacent inner layer, between an outer layer and an inner layer separated by one or more inner layers, and between an outer layer or inner layer and a component. Inter-layer shielding may be employed in conjunction with intra-layer shielding to provide shielding for an entire run of a transmission line spanning multiple layers. Inter-layer shielding may also be employed around component contacts such as electrically conducting pins. The shielding around the component contacts is designed to mate with a second portion of inter-layer shielding connected with intra-layer shielding such that an overlap is formed.

9 Claims, 7 Drawing Sheets

REDUCING OR ELIMINATING CROSS-TALK AT DEVICE-SUBSTRATE INTERFACE

FIELD OF THE INVENTION

This invention is generally related to printed circuit boards, and more particularly to inter-layer shielding.

BACKGROUND OF THE INVENTION

It has always been a trend in the field of electronics to develop more complex, higher performance devices in the smallest practical size. Consequently, the density of connectors and conductive traces, and transmission rates on those connectors and traces is always increasing. Current manufacturing techniques enable reliable production of circuit boards with such great density and transmission rates that signal integrity is compromised by both cross-talk between densely packed traces and electromagnetic interference ("EMI") from other components in the surrounding environment. It would therefore be desirable to have practical means for mitigating these factors which compromise signal integrity.

SUMMARY OF THE INVENTION

In accordance with the present invention a portion of a signal transmission line which is orthogonal with the planes defined by layers of the printed circuit board is surrounded by grounded shielding, i.e., inter-layer shielding. The inter-layer shielding is a continuous, electrically conductive, grounded wall structure. Inter-layer shielding may be disposed between adjacent inner layers, between inner layers separated by one or more inner layers, between an outer layer and an adjacent inner layer, between an outer layer and an inner layer separated by one or more inner layers, and between an outer layer or inner layer and a component.

In one embodiment of the invention inter-layer shielding is employed in conjunction with intra-layer shielding to provide even greater protection against cross-talk and EMI. Intra-layer shielding is a grounded wall around a transmission line along a run on a single printed circuit board layer. The intra-layer shielding may include an opening at a position where an electrical connection to another layer or component is desired. The inter-layer shielding is connected with the intra-layer shielding proximate to the opening such that a conductor may be disposed within the inter-layer shielding in contact with the transmission line either directly or with a connector such as a via-in-pad. Neither the intra-layer shielding nor the inter-layer shielding contact the transmission line or conductor.

In another embodiment of the invention inter-layer shielding is employed as an integral part of a component around contacts such as electrically conducting pins. The shielding around the component contacts is designed to mate with a second portion of inter-layer shielding connected with intra-layer shielding such that an overlap is formed. The two inter-layer shieldings may be closely mated such that the component contact shielding is in physical contact with the second portion of inter-layer shielding. Further, the exposed overlap junction may be sealed with a conductive material. Alternatively, the shieldings may be loosely mated such that they are not in physical contact, but the overlap and gap between the shieldings present no line-of-sight path between the environment and the contact within the shieldings.

Inter-layer shielding advantageously mitigates undesirable cross-talk and EMI. In particular, the grounded shielding tends to reduce or eliminate the undesirable effects of cross-talk and EMI on the portion of conductor within the shielding. When used in conjunction with intra-layer shielding, protection against cross-talk and EMI is extended along entire runs which traverse multiple printed circuit board layers. When used in conjunction with components, protection is extended into the component packaging. Each of these techniques advantageously enables more densely packed transmission lines of higher frequency.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENTS

Figure 1:
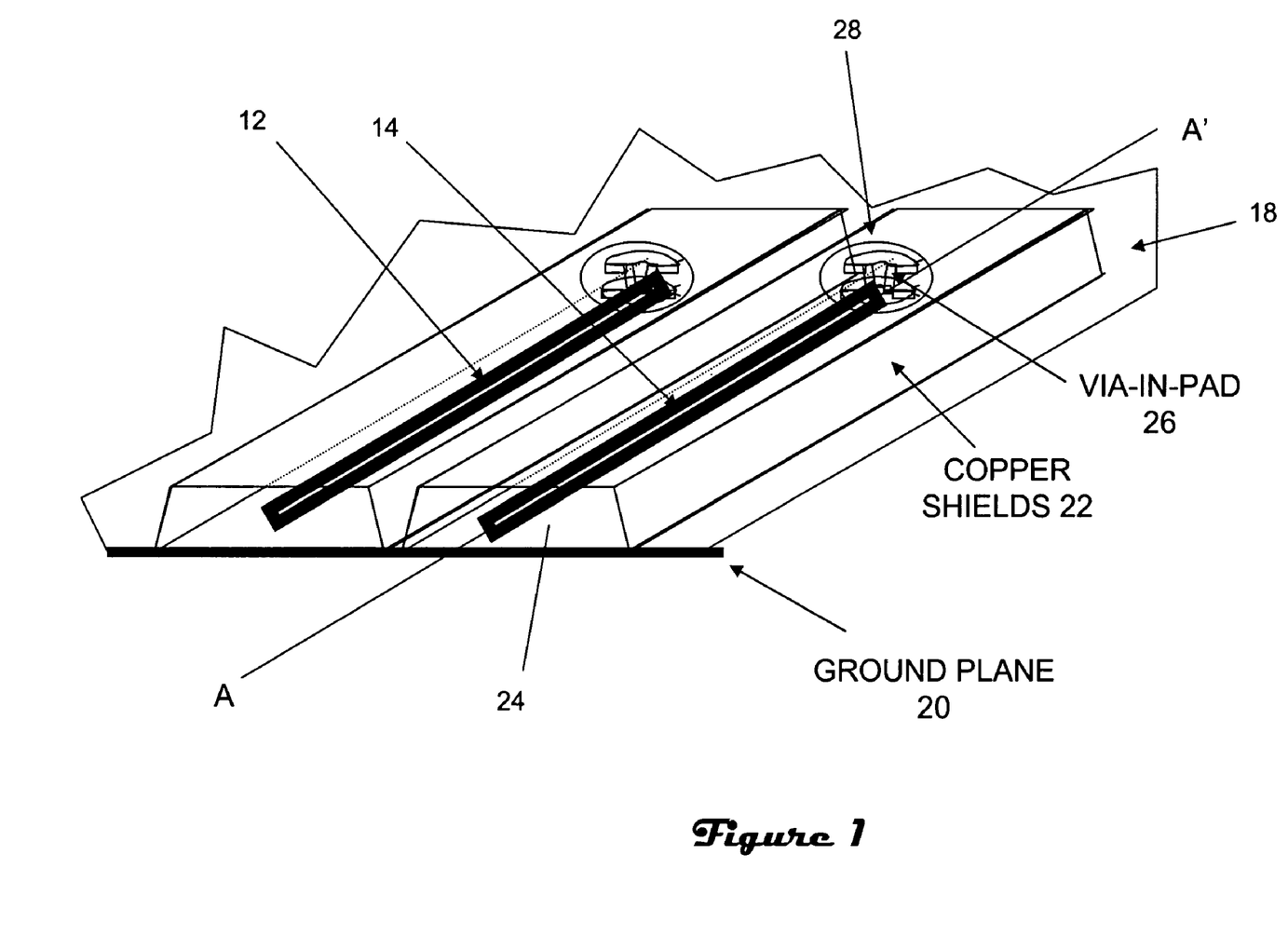
FIG. 1 is a perspective view of inter-layer shielding.
Figure 2:
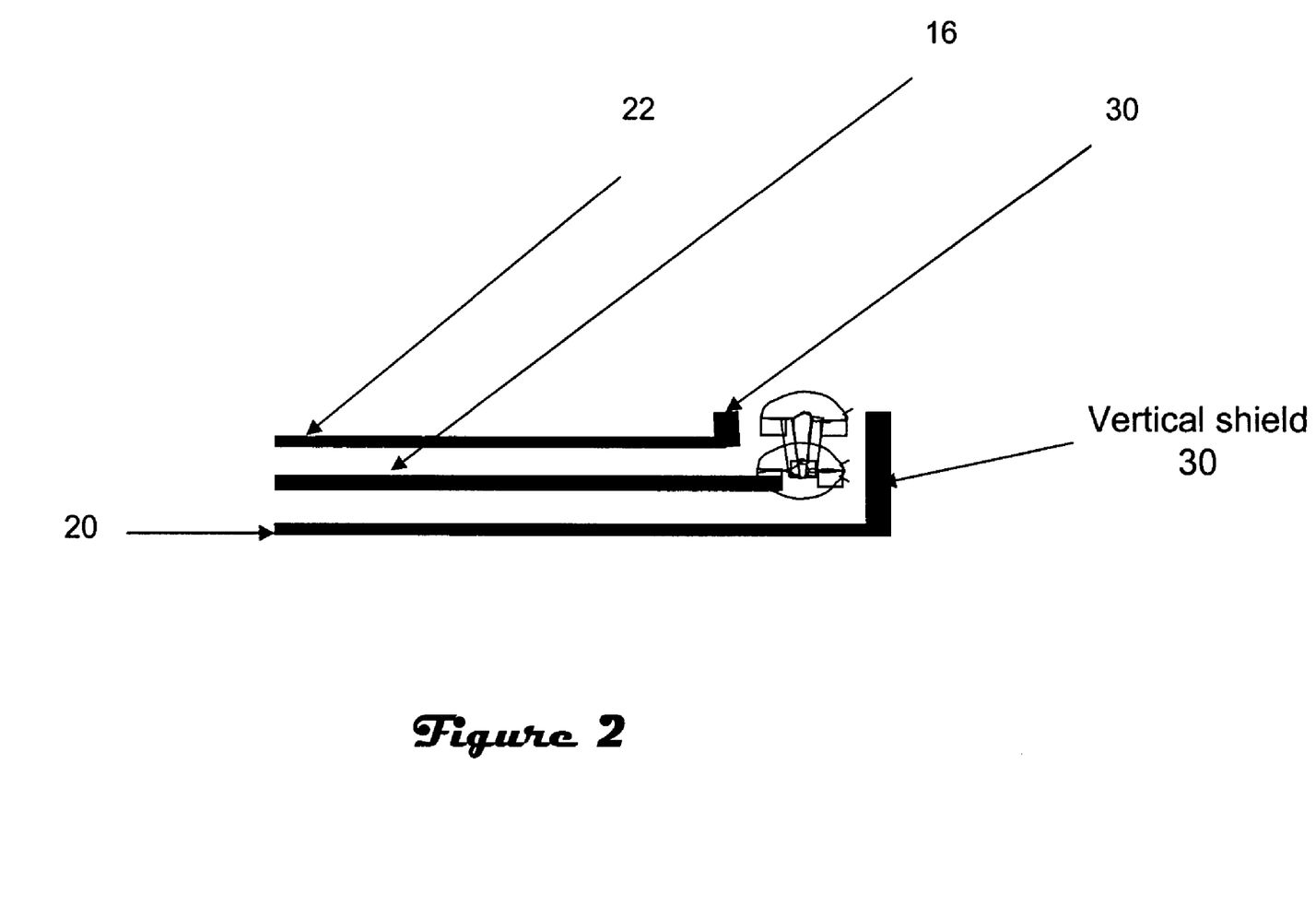
FIG. 2 is a cross-sectional view of the shielding of FIG. 1 taken along A–A'.

Referring to FIGS. 1 and 2, a printed circuit board includes signal transmission lines 12, 14 for transmitting signals between components on the board, and also between components on the board and other components associated with other boards. Each transmission line includes a conductor 16, such as a copper trace, disposed on a substrate 18. In the case of a multi-layer circuit board, a plurality of signal layers with transmission lines, power layers and ground layers are laminated in parallel. The power and ground layers are sometimes referred to as power and ground "planes" because they typically include relatively large areas of conductive material and relatively few traces. In the illustrated embodiment a signal layer is disposed adjacent to a ground plane 20.

The transmission line is shielded along intra-layer runs by a grounded, electrically conductive shield 22 such as that described in U.S. Pat. No. 6,444,922 which is incorporated by reference. The intra-layer shield 22 is connected with the ground plane 20 in order to form a wall that completely surrounds, but does not contact, the conductor. The connection between the intra-layer shielding and the ground plane also provides the requisite grounding of the shielding. The volume of the transmission line between the conductor and the shield is filled with a dielectric material 24 such as thermoplastic polymer modified epoxy resin and glass cloth (e.g., FR4, FR5), polytetrafluoroethylene ("Teflon") or other materials having similar dielectric constant.

Means for providing electrical interconnection between layers, i.e., inter-layer connection, are employed to interconnect corresponding transmission lines on parallel signal layers and also to connect components with transmission lines. For example, a via-in-pad 26 may be disposed at least partially within the intra-layer shielding 22 and in contact with the conductor 16. The intra-layer shielding includes an opening 28 proximate to the electrical interconnect 26 to permit interconnection with a parallel layer of the printed circuit board without shorting to the shielding. For example, the transmission line may include a conductive material disposed through the opening and between corresponding inter-layer connectors associated with different layers of the printed circuit board. Similarly, the conductive material may be disposed through the opening, and between the inter-layer connector and a component.

Referring now to FIGS. 1 and 2, in contrast with known shielding techniques, the portion of the transmission line which traverses between first and second layers of a printed circuit board, or between a first layer and a component, is surrounded by grounded inter-layer shielding 30. The inter-layer shielding 30 is orthogonal with planes defined by printed circuit board layers and may be formed from copper, conductive paste or other suitable electrically conductive materials. The inter-layer shielding is connected with the intra-layer shielding 22 proximate to the opening 28 in the intra-layer shielding. The connection with the intra-layer shielding provides an electrically conductive pathway to the ground plane 20, i.e., grounding of the inter-layer shielding. Consequently, the combined shielding structure is a continuous, uninterrupted (except at termination) barrier to cross-talk and EMI.

The inter-layer shielding 30, shown in FIG. 2, may be employed to provide shielding between an inner layer and an outer layer, between first and second inner layers, and also between a transmission line and an electronic component. To provide shielding between an inner layer and an outer layer, the shielding extends from the intra-layer shielding on the inner layer to the outer layer. It should be noted that the interconnected layers may be adjacent or separated by one or more intermediate layers. To provide shielding between transmission lines on different layers, the shielding may be formed around aligned via-in-pad type connectors which are connected with a conductive material. Again, the interconnected layers may be adjacent or separated by one or more intermediate layers.

Figure 3:
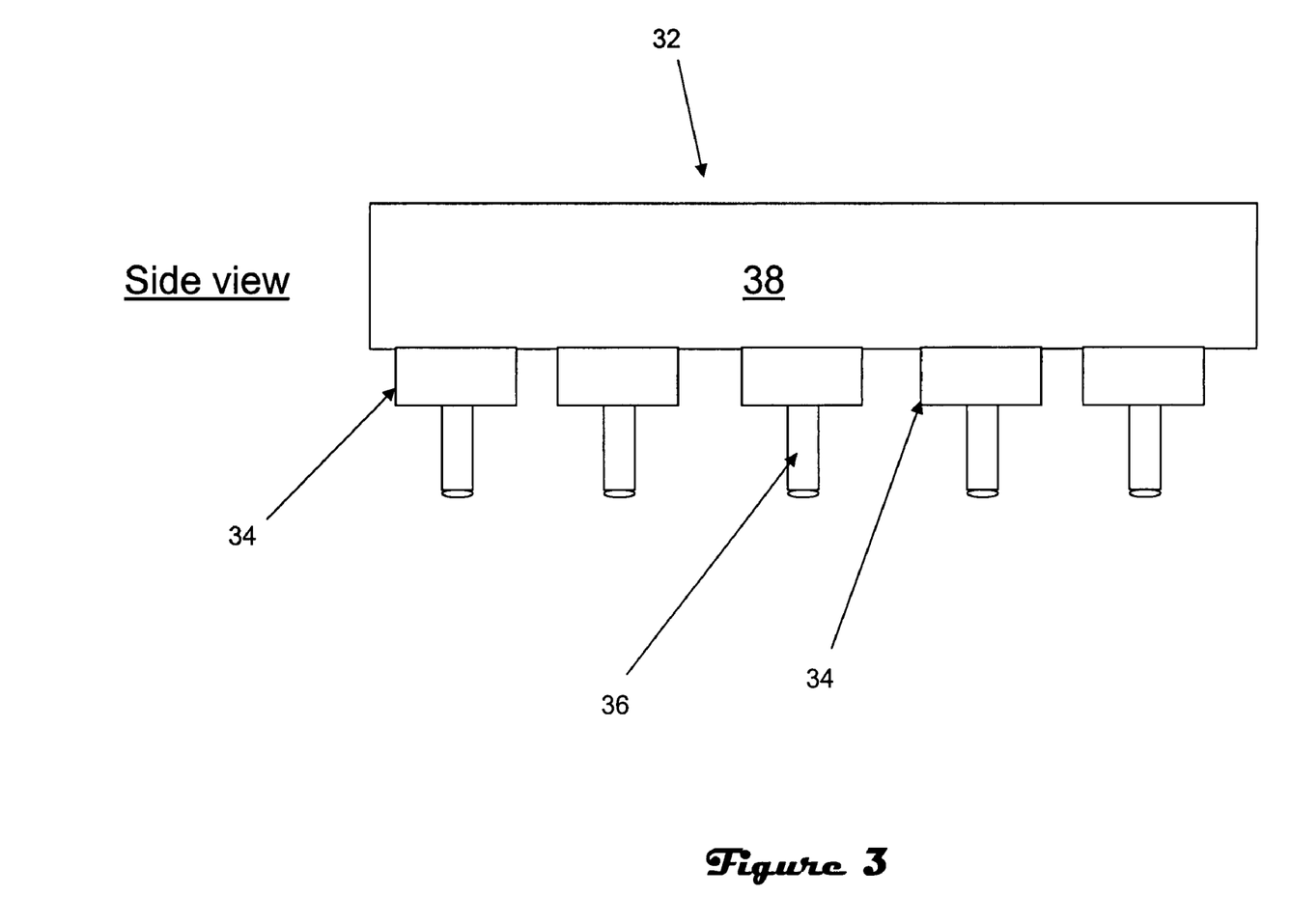
FIG. 3 is a side-view diagram of component contact shielding for use with the shielding of FIGS. 1 and 2.
Figure 4:
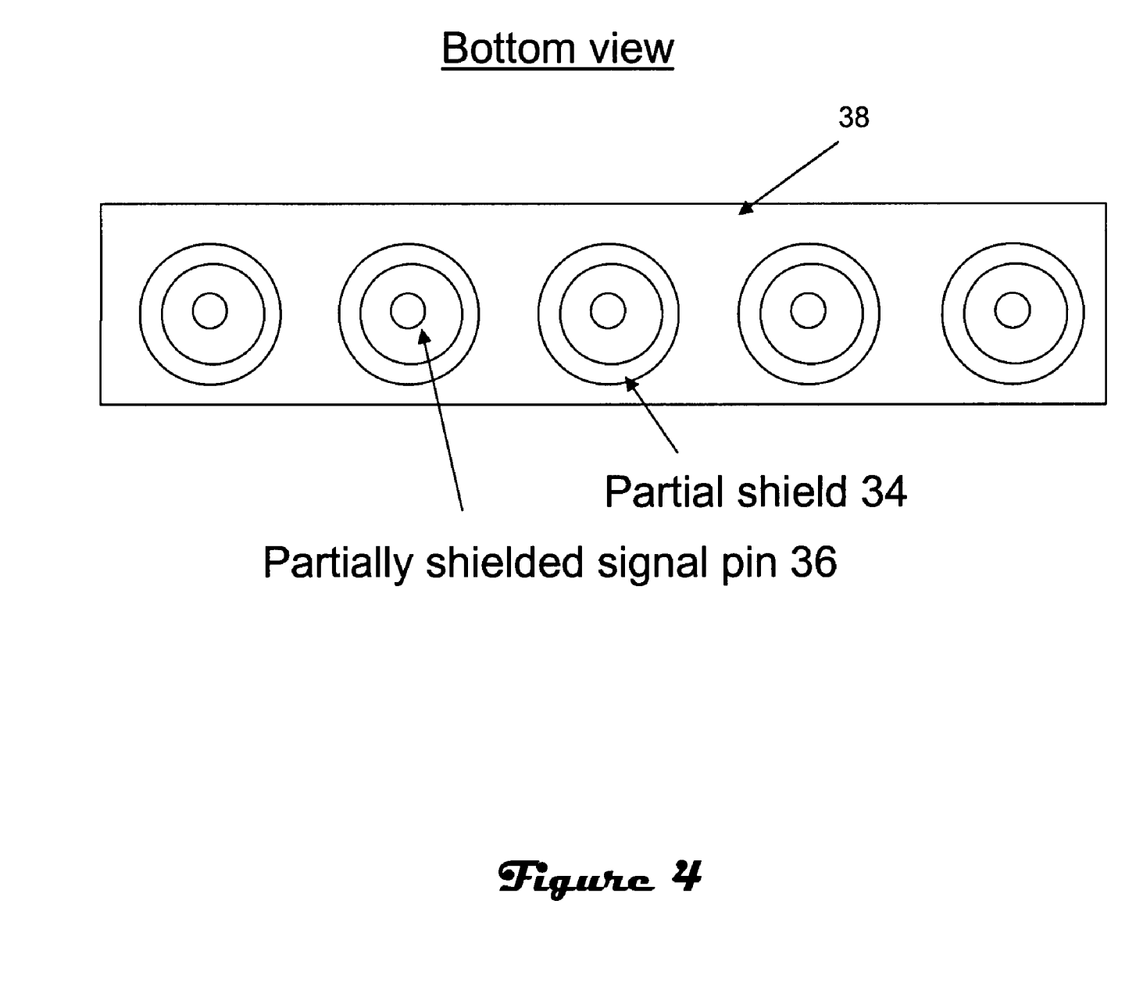
FIG. 4 is a bottom-view of the shielding of FIG. 3.

FIGS. 3 and 4 illustrate use of the inter-layer shielding 34 to provide EMI and cross-talk protection for an electrical contact 36 of an electronic component 32. In particular, inter-layer shielding 34 is provided as an integral part of the electronic component. The component contact shielding 34 is formed around the electrical contacts 36 starting from within the component packaging 38. In the illustrated embodiment the shielding 34 includes cylindrical walls disposed around pins which extend from within the component packaging. It should be noted that the shielding may be other than cylindrical, and contacts other than pins may be employed. Further, the contacts could also extend only slightly from the packaging, or even be recessed slightly into or on the surface of the packaging. Similarly, the shielding may extend beyond the contacts, or the contacts may extend beyond the shielding (as illustrated).

Figure 5:
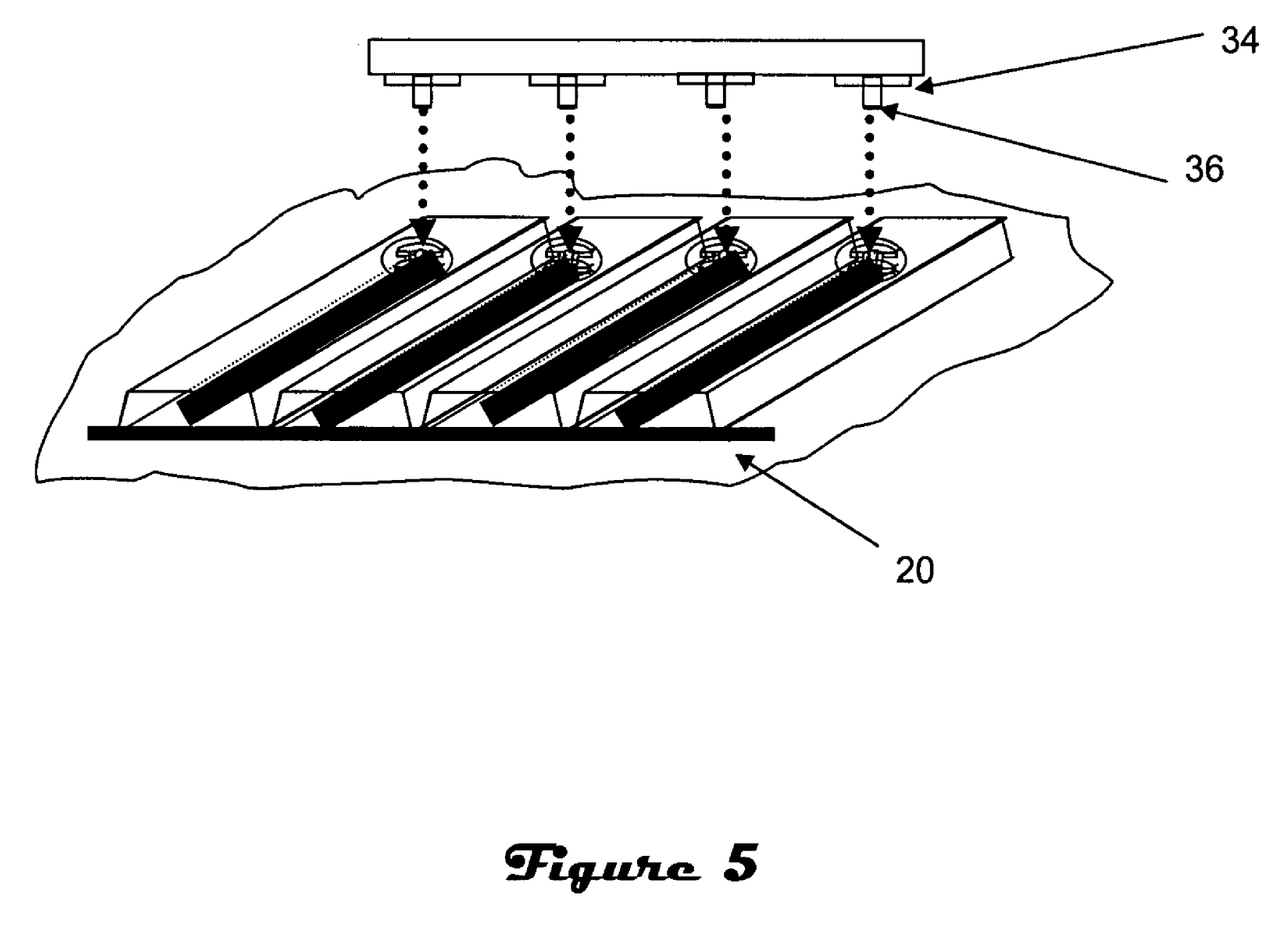
FIG. 5 is a perspective view illustrating use of the shielding of FIG. 3 with the shielding of FIGS. 1 and 2.
Figure 6:
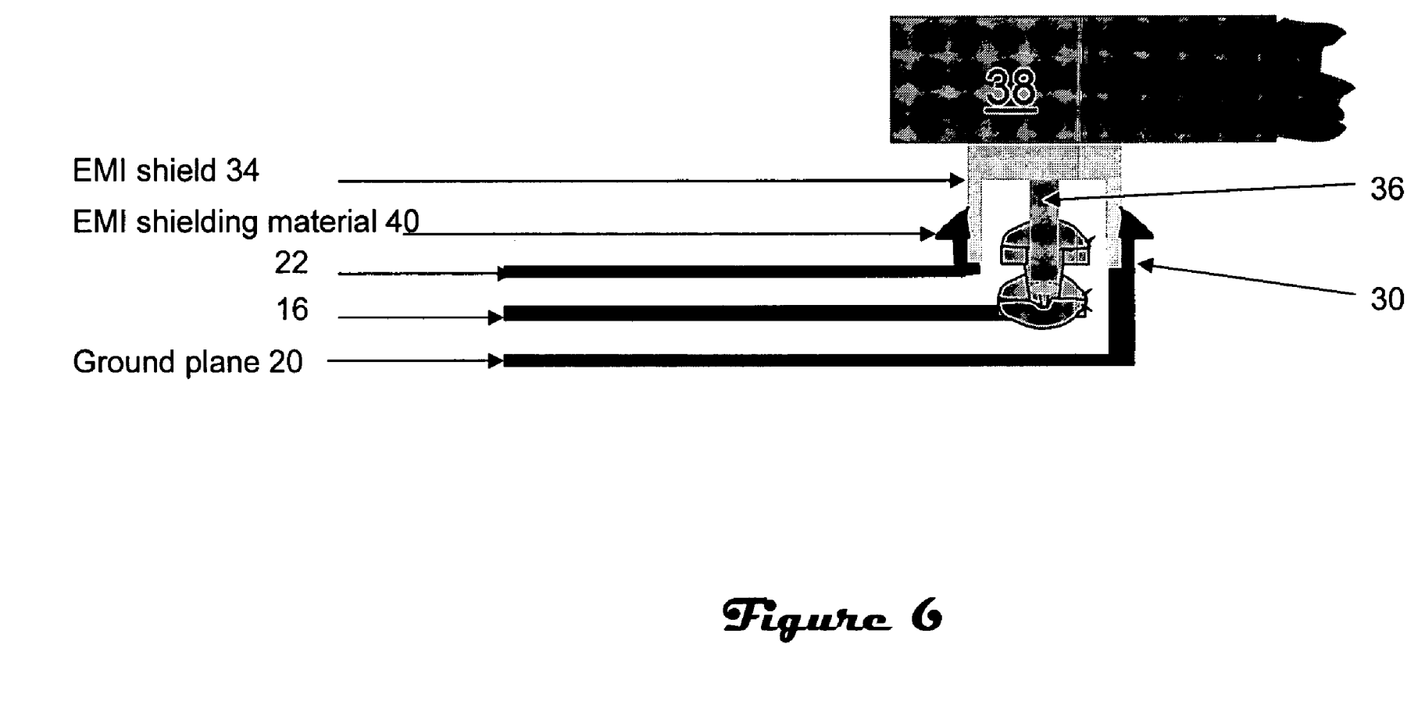
FIG. 6 is a cross-sectional view of the interconnected shieldings of FIG. 5 taken along line B–B'.

FIGS. 5 and 6 illustrate mating between the inter-layer shielding 30 and the component contact shielding 34 when the component is mounted on the printed circuit board. Both the inter-layer shielding and the component contact shielding have circular cross-sectional geometry. A relatively short component pin length may be employed to facilitate maintenance of good signal integrity. The radius of the component contact shielding is less than the radius of the inter-layer shielding by approximately the thickness of the inter-layer shielding. Hence, a press-fit is formed when the component contact shielding 34 is inserted into the inter-layer shielding 30. Some minor deformation of the shieldings 30, 34 may be acceptable, or even desirable, to establish a tight fit. Further, an EMI shielding material 40 such as conductive paste, solder or other material is disposed at the junction of the overlap proximate to the exposed end of the inter-layer shielding. As shown specifically in FIG. 5, an array of inter-layer shielded transmission lines and corresponding shielded component contacts may be aligned and employed together. Further, the strength of the connection between the shielding may be employed to augment or substantially fulfill the need to secure the component to the printed circuit board.

Figure 7:
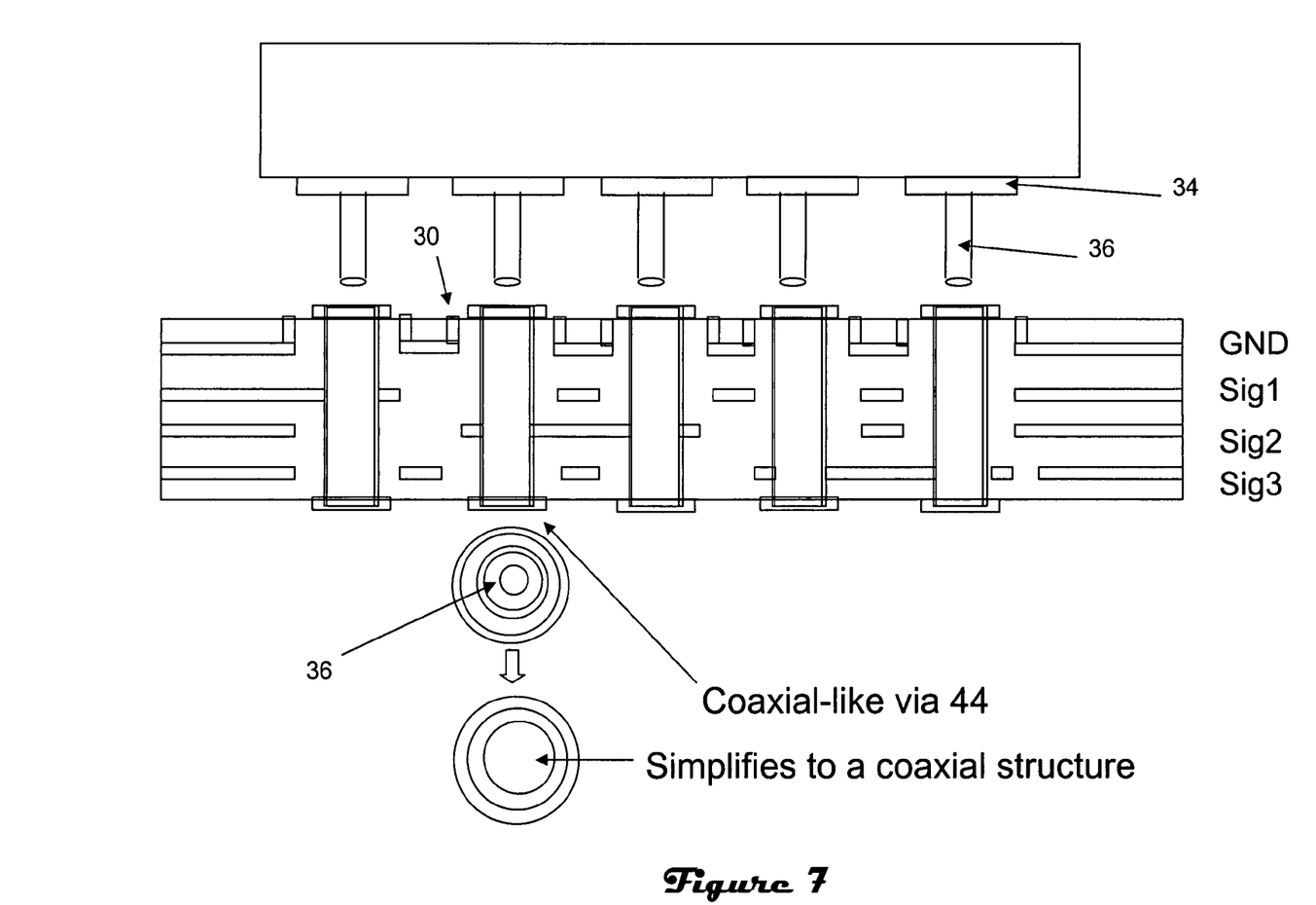
FIG. 7 is a diagram of an alternative implementation of the shielding of FIG. 3 with the shielding of FIGS. 1 and 2.

Referring to FIG. 7, a loose fit between the inter-layer shielding 30 and the component shielding 34 may also be employed with a coaxial via 44 formed using inter-layer shielding 30. In this embodiment there is little or no contact between the component contact shielding and the inter-layer shielding associated with the transmission line. The inter-layer shielding associated with the transmission line is grounded through connection with intra-layer shielding as already described or direct connection with a ground plane. However, the component contact shielding 34 is grounded through connection with a ground contact of the component, which is connected with the ground plane through one of the component contacts 36. The overlap between the component contact shielding and the inter-layer shielding may be designed such that there is no line-of-sight path between the internal conductor and the exterior environment when the component is mounted on the printed circuit board. The loose fit embodiment may facilitate ease of component mounting and reduce requisite manufacturing tolerances.

It should be noted that component shielding 34 may be implemented independent of inter-layer shielding. In particular, there is advantage to shielding the pin contact between the device packaging and the printed circuit board even if inter-layer shielding is not employed for that pin.

In view of the forgoing descriptions of the various embodiments of the invention, it will be appreciated that inter-layer shielding mitigates undesirable cross-talk and EMI around a "vertical" axis orthogonal with the planes defined by layers of the printed circuit board. In particular, the grounded shielding tends to reduce or eliminate the undesirable effects of cross-talk and EMI on the portion of conductor within the shielding. When used in conjunction with intra-layer shielding, protection against cross-talk and EMI can be extended along entire runs. When used in conjunction with components, protection is extended into the component packaging. Each of these techniques, which may be employed alone or in combination with the other techniques, advantageously enables more densely packed transmission lines of higher frequency.

While the invention is described through the above exemplary embodiments, it will be understood by those of ordinary skill in the art that modification to and variation of the illustrated embodiments may be made without departing from the inventive concepts herein disclosed. Moreover, while the preferred embodiments are described in connection with various illustrative data structures, one skilled in the art will recognize that the system may be embodied using a variety of specific structures. Accordingly, the invention should not be viewed as limited except by the scope and spirit of the appended claims.

What is claimed is:

1. Apparatus for transmitting a signal on a printed circuit board having at least one layer comprising:

a conductor having a first segment disposed orthogonally with the at least one layer of the printed circuit board and a second segment disposed on a layer of the printed circuit board;

inter-layer grounded shielding which encloses the first segment of the conductor; and intra-layer grounded shielding, orthogonal to the inter-layer shielding, which encloses the second segment of the conductor, the inter-layer and intra-layer grounded shielding being interconnected without gap therebetween.

2. The apparatus of claim 1 wherein a dielectric material is disposed between the shielding and the conductor.

3. The apparatus of claim 1 wherein the shielding is disposed between adjacent inner layers of the printed circuit board.

4. The apparatus of claim 1 wherein the shielding is disposed between first and second inner layers that are separated by a third inner layer.

5. The apparatus of claim 1 wherein the shielding is disposed between an outer layer and an inner layer.

6. The apparatus of claim 1 wherein the shielding is disposed between an outer layer and a component.

7. The apparatus of claim 1 wherein the shielding is disposed between an inner layer and a component.

8. The apparatus of claim 1 wherein an intra-layer portion of the conductor is disposed in parallel with the at least one layer of the printed circuit board, and further including intra-layer shielding around that portion of the conductor connected with the inter-layer shielding.

9. Apparatus for transmitting multiple signals on a printed circuit board having at least one layer comprising:

multiple conductors, each individual conductor having a first segment disposed orthogonally with the at least one layer of the printed circuit board and a second segment disposed on a layer of the printed circuit board;

inter-layer grounded shielding which encloses the first segments of the conductors such that the individual conductors are shielded from each other; and intra-layer grounded shielding, orthogonal to the inter-layer shielding, which encloses the second segments of the conductors, such that the individual conductors are shielded from each other, wherein the inter-layer and intra-layer grounded shielding are interconnected without gap therebetween.

* * * * *